(12) United States Patent
Kim

(10) Patent No.: US 7,087,319 B2
(45) Date of Patent: Aug. 8, 2006

(54) ORGANIC ELECTRO LUMINESCENCE DISPLAY USING METALLOCENE COMPOUND

(75) Inventor: Jang-Sub Kim, Kyungki-do (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 362 days.

(21) Appl. No.: 10/655,694

(22) Filed: Sep. 5, 2003

(65) Prior Publication Data

US 2004/0091740 A1 May 13, 2004

(30) Foreign Application Priority Data

Sep. 5, 2002 (KR) .......................... 2002-0053538

(51) Int. Cl.
*H01L 51/54* (2006.01)
*H05B 33/14* (2006.01)

(52) U.S. Cl. .................. 428/690; 428/917; 313/504; 257/40; 257/103; 257/E51.027; 257/E51.041

(58) Field of Classification Search ............... 528/9
See application file for complete search history.

(56) References Cited

U.S. PATENT DOCUMENTS 5,281,489 A * 1/1994 Mori et al. ................. 428/690
5,902,677 A * 5/1999 Shi et al. .................... 428/332

OTHER PUBLICATIONS

Hirao et al., "Synthesis, electrochemistry and photoconductivity of oligo- and poly-(1,1'-dehexylferrocenylenes)", J. Chem. Soc., Dalton Trans., 1996, pp. 2929-2933.*
Buretea et al., "Poly(ferrocenylenevinylene) from Ring-Opening Metathesis Polymerization of ansa-(Viinylene)ferrocene", Organometallics, vol. 16, No. 7, 1997, pp. 1507-1510.*

* cited by examiner

*Primary Examiner*—Marie Yamnitzky
(74) *Attorney, Agent, or Firm*—DLA Piper Rudnick Gray Cary US LLP

(57) ABSTRACT

The present invention relates to an organic electroluminescence display using a metallocene compound, and more particularly to an organic electroluminescence display with a simple structure using a metallocene compound, which has superior photoconductivity, can be used as a p-type semiconductor material, and functions as a superior luminescent material, as a luminescent material.

6 Claims, 1 Drawing Sheet

ORGANIC ELECTRO LUMINESCENCE DISPLAY USING METALLOCENE COMPOUND

RELATED APPLICATION

This patent application claims priority from Korean Patent Application No. 2002- 0053538 filed on Sep. 5, 2002, which is incorporated herein by reference in its entirety.

BACKGROUND OF THE INVENTION (a) Field of the Invention

The present invention relates to an organic electroluminescence display using a metallocene compound, and more particularly to an organic electroluminescence display with a simple structure using a metallocene compound as a luminescent material.

(b) Description of the Related Art

The basic concept of an OELD (Organic Electro-Luminescence Display) is to obtain light energy from an organic luminescent material located between two electrodes to which an electric field is applied. Differently from an LCD, an OELD is an emissive display with a fast response, a wide view angle, and high contrast. Also, since it enables a flexible display that is thinner than 2 mm, it is emerging as a next-generation flat panel display (FPD).

Organic luminescent materials used for an OELD are classified as low molecular compounds and polymer compounds. A representative substance of the low molecular compounds is $Al(HQ)_3$ (HQ is 8-hydroxyquinoline), a green-luminescent aluminum quinoline derivative developed by Kodak, and a representative substance of the polymer compounds is poly(p-phenylenevinylene) (PPV) developed by CDT (Cambridge Display Technology).

The low molecular organic EL devices have been developed actively since the mid-1980s, but development of the polymer organic EL devices is only at the initial state. While a low molecular organic EL device requires an electron/hole injection layer and a transport layer in addition to an emission layer, a polymer organic EL luminescent device can have a simple organic EL structure due to the inherent double bonding (π-bonding; resonance structure) of the polymer organic EL luminescent material. That is, the polymer organic EL material can be formed into a film between two electrodes using a spin coater or an ink jet to make an organic EL device easily.

Much research and development has been undertaken on conductive polymers having intramolecular π-electron resonance structures. Currently, PPV and its derivatives, poly(3-alkyl-thiophene) (PAT) and its derivatives, poly(9,9-dialkylfluorene) (PDAF), and so forth are known. These compounds are readily soluble in solvents and form thin films on a substrate. Additionally, any color, including blue, green, and red, can be obtained by selecting compounds with different side chains.

Accordingly, consistent research on polymer luminescent materials and their physical properties is required to develop an organic electroluminescence display with a simple structure.

SUMMARY OF THE INVENTION

An object of the present invention is to provide a simple-structured organic electroluminescence display comprising a new metallocene compound, which has superior photoconductivity, can be used as a p-type semiconductor material, and functions as a superior luminescent material.

To attain the object, the present invention provides an organic electroluminescence display that comprises a compound represented by the following Chemical Formula 1 between an anode and a cathode:

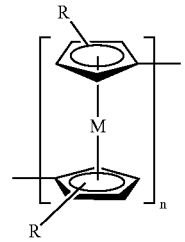

Chemical Formula 1 wherein R is independently or simultaneously hydrogen, a linear or branched $C_1$ to $C_{20}$ alkyl, or an aromatic group; M is a transition metal or a nonmetal; and n is an integer between 6 and 100.

The present invention also provides an organic electroluminescence display that comprises a compound represented by the following Chemical Formula 2 between an anode and a cathode:

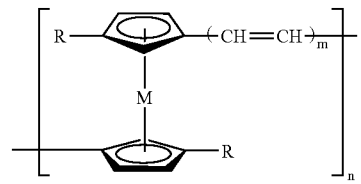

Chemical Formula 2 wherein R is independently or simultaneously a linear or branched $C_1$ to $C_{20}$ alkyl or an aromatic group; M is a transition metal or a nonmetal; m is an integer between 1 and 100; and n is an integer between 6 and 100.

Preferably, the present invention also provides an organic electroluminescence display that comprises a compound represented by the following Chemical Formula 3 between an anode and a cathode:

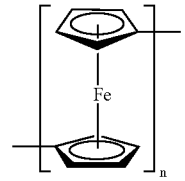

Chemical Formula 3 wherein n is an integer between 6 and 100.

Preferably, the present invention also provides an organic electroluminescence display that comprises a compound represented by the following Chemical Formula 4 between an anode and a cathode:

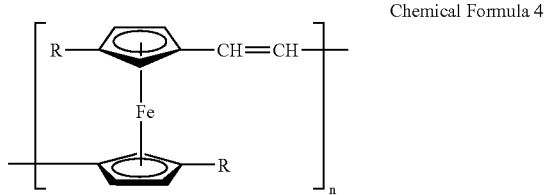

Chemical Formula 4 wherein R is independently or simultaneously a linear or branched $C_1$ to $C_{20}$ alkyl or an aromatic group, and n is an integer between 6 and 100.

The present invention also provides a display device comprising the polymer organic electroluminescence display. Preferably, the display device is a flat panel display (FPD).

DETAILED DESCRIPTION OF THE PREFERRED EMBODIMENTS

Figure 1:
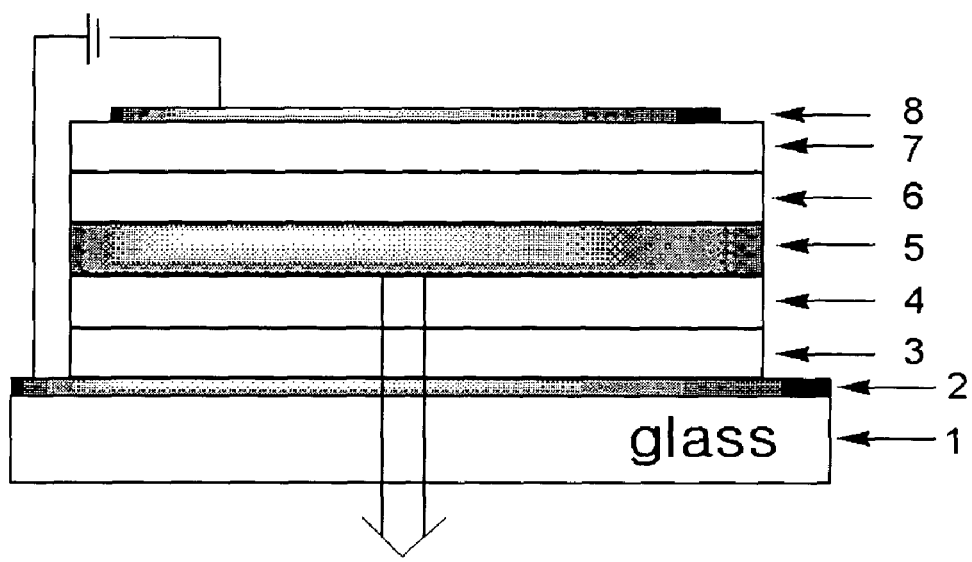
FIG. 1 is a cross-sectional view of a low molecular organic electroluminescence display using the conventional low molecular material.

Hereinafter, the present invention is described in more detail.

The present invention is characterized by a new-concept polymer organometallic EL compound including metallocene in the molecule, and an organic electroluminescence display using this compound.

Metallocene is a sandwich-structured compound comprising two C5 pentagonal rings and a metal atom, and a polymer compound including metallocene shows electroconductivity.

Based on this fact, the present invention uses compounds represented by Chemical Formula 1, Chemical Formula 2, Chemical Formula 3, and Chemical Formula 4 as polymer materials of an organic electroluminescence display The compounds represented by Chemical Formulas 1 to 4 all show better solubility to solvents compared with the conventional polymer luminescent materials, as well as photoconductivity and p-type semiconductor characteristics due to changes in oxidation states. Also, they show sufficient luminescence capacity due to intramolecular electron resonance structures. In addition, the core metal can be replaced by a different transition metal in the present invention to obtain a polymer organometallic EL compound having different properties (e.g. luminescence wavelength).

A preferred example of the poly(metallocenylene) represented by Chemical Formula 1 is poly(1,1'-dihexylferrocenylene) obtained by substituting one of four hydrogens of cyclophenylene with hexyl.

Most preferably, the compound represented by Chemical Formula 1 is a metallocene compound represented by the following Chemical Formula 3, with both Rs being hydrogens and M being Fe:

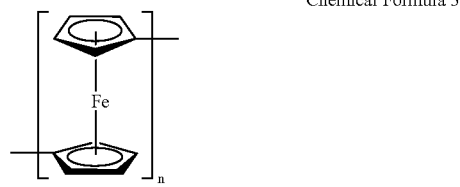

Chemical Formula 3 wherein n is an integer between 6 and 100.

Poly(ferrocenylene), or the compound represented by Chemical Formula 3, is synthesized by the following Scheme 1:

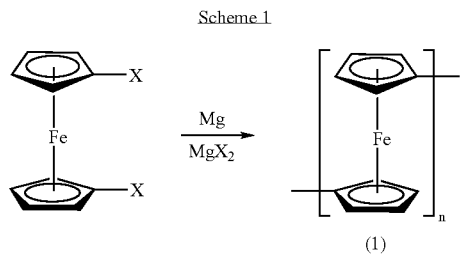

Scheme 1 wherein X is Br or I, and n is an integer between 6 and 100.

The compound represented by Chemical Formula 3 is a brown polymer compound. It is readily soluble in solvents, and is crystalline or amorphous depending on the reaction condition. Also, it has an electroconductivity of $\sigma=10^{-2}$ Scm after oxidation by an oxidant.

An ethylene having a π-bond can be introduced in the sandwich structure to obtain poly(metallocenylenevinylene) represented by Chemical Formula 2, a new polymer luminescent material.

Most preferably, the compound represented by Chemical Formula 2 is a metallocene compound represented by the following Chemical Formula 4, with M being Fe and m being 1:

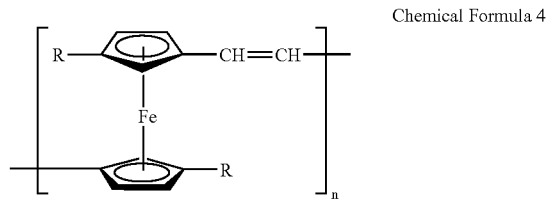

Chemical Formula 4 wherein R is independently or simultaneously a linear or branched $C_1$ to $C_{20}$ alkyl or an aromatic group, and n is an integer between 6 and 100.

Poly(ferrocenylenevinylene), or the compound represented by Chemical Formula 4, is synthesized by the following Scheme 2:

Scheme 2

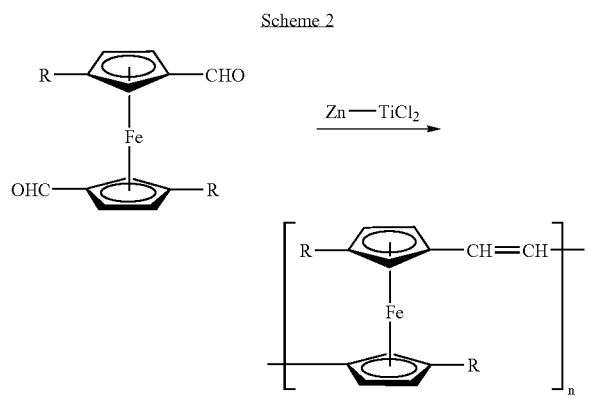

wherein R is independently or simultaneously a linear or branched $C_1$ to $C_{20}$ alkyl or an aromatic group, and n is an integer between 6 and 100.

Preferably, R is —$C_2H_5$, —$C_5H_{13}$, or $C_{12}H_{25}$, independently or simultaneously.

The compound represented by Chemical Formula 4 has an electroconductivity of $\sigma = 10^{-2}$ Scm.

Figure 2:
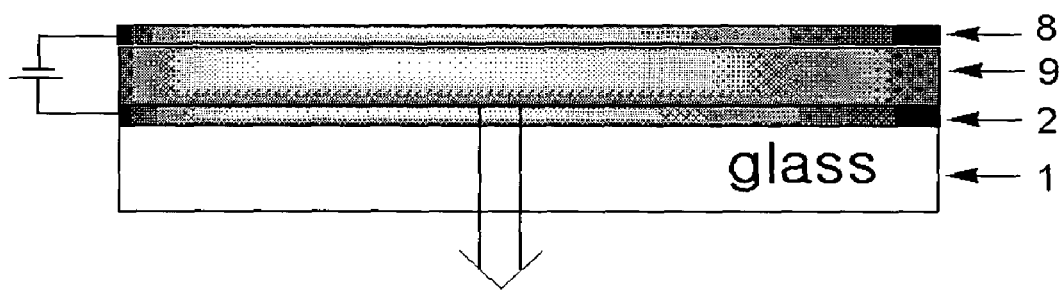
FIG. 2 is a cross-sectional view of a polymer organic electroluminescence display using a metallocene compound as an organic luminescent material according to the present invention.

As seen in FIG. 2, an organic electroluminescence display of the present invention may comprise a substrate, an anode, a polymer organic luminescence layer, and a cathode. In the present invention, an organic electroluminescence display having a simple structure can be prepared by using the compound of the present invention in the polymer organic luminescence layer between the anode and the cathode.

Hereinafter, a preferred example of preparing an organic electroluminescence display of the present invention is described.

Firstly, a thin film of an anodic material is deposited or sputtered to a thickness of 10 to 200 nm on a substrate, e.g., a glass substrate, to prepare an anode. For the anodic material, a material having conductivity and a relatively high work function is used. For example, metal oxides such as indium tin oxide, indium zinc oxide, and tin oxide; metals such as aluminum and chromium; and mixtures thereof can be used.

Then, the compound represented by Chemical Formula 1, Chemical Formula 2, Chemical Formula 3, or Chemical Formula 4, or any mixture thereof is formed into a film of a thickness of 5 nm to 5 μm on the anode with a spin coater or an ink jet to prepare a polymer organic luminescence layer. With the spin coater method, which is also used for a photoresist process of TFT-LCDs, a uniform layer can be formed on a large substrate with simple equipment.

Lastly, a thin film of a cathodic material is deposited to a thickness of 10 to 200 nm on the polymer organic luminescence layer, to prepare an organic electroluminescence display. For the cathodic material, a material having a relatively low work function is preferable. For example, magnesium, calcium, lithium, aluminum, indium, or any mixture thereof can be used. In addition, a transparent electrode, e.g., a thin film of indium tin oxide or indium zinc oxide, may be deposited on the metallic cathode for transmittivity.

The present invention also provides a display device comprising the polymer organic electroluminescence display. Preferably, the display device is a flat panel display (FPD) such as a liquid crystal display (LCD), a field emission display (FED), an electro luminescence display (EL), and a plasma display panel (PDP).

The flat display device can be prepared by the conventional method using the polymer organic electroluminescence display of the present invention.

The liquid crystal display comprises a pair of display panels equipped with a plurality of field generating electrodes with a liquid crystal layer between them. A difference in voltages applied to the field-generating electrodes generates an electric field in the liquid crystal layer, and the arrangement of the liquid crystal molecules is changed by the difference in the electric field. The change of the arrangement of the liquid crystal molecules changes light transmittivity through the liquid crystal layer. Therefore, an image can be obtained by controlling the difference of voltages applied to the pixel electrode and the common electrode.

In the electro luminescence display, light is emitted by providing current to the electro luminescence device by applying data voltage to the pixel circuit, and an image is displayed by controlling the data voltage.

Hereinafter, the present invention is described in more detail through Examples. However, the following Examples are only for the understanding of the present invention, and the present invention is not limited by them.

EXAMPLES

Example 1

An anode was formed on a transparent glass substrate using ITO (Indium tin oxide), as in FIG. 2. Then, the compound represented by Chemical Formula 1a was coated to a thickness of 30 nm using a spin coater to form a polymer organic luminescence layer. Next, an Al electrode layer was deposited to a thickness of 10 nm to prepare a polymer organic electroluminescence display.

Chemical Formula 1a

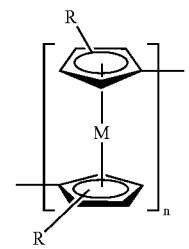

In Chemical Formula 1a, both Rs are —$C_2H_5$, M is a transition metal or a nonmetal, and n is an integer between 6 and 100.

Example 2

A polymer organic electroluminescence display was prepared as in Example 1, using a compound represented by the following Chemical Formula 2a instead of the compound represented by Chemical Formula 1a:

Chemical Formula 2a

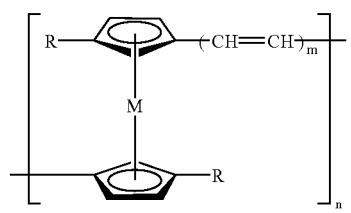

wherein both Rs are —$C_2H_5$, M is a transition metal or a nonmetal, m is an integer between 1 and 100, and n is an integer between 6 and 100.

Example 3

A polymer organic electroluminescence display was prepared as in Example 1, using a compound represented by the following Chemical Formula 3a instead of the compound represented by Chemical Formula 1a:

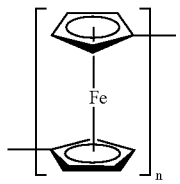

Chemical Formula 3a wherein n is an integer between 6 and 100.

Example 4

A polymer organic electroluminescence display was prepared as in Example 1, using a compound represented by the following Chemical Formula 4a instead of the compound represented by Chemical Formula 1a:

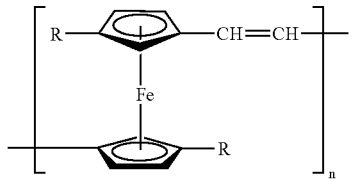

Chemical Formula 4a wherein both Rs are —$C_2H_5$, and n is an integer between 6 and 100.

As explained above, the present invention provides a luminescent material containing metallocene, which can be used as a p-type semiconductor material and functions as a superior luminescent material, and a simple-structured organic electroluminescence display using the same. Accordingly, the organic electroluminescence display of the present invention can be used for an organic electro luminescence display, such as a flat panel display (FPD), all display devices using luminescent materials, and all display devices using an organic TFT.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A polymer organic electroluminescence display comprising a substrate, an anode, a polymer organic luminescence layer, and a cathode, where the polymer organic luminescence layer comprises a compound represented by the following Chemical Formula 1:

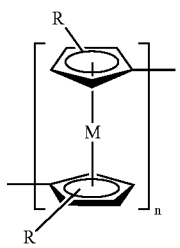

Chemical Formula 1 wherein R is independently or simultaneously hydrogen, a linear or branched $C_1$ to $C_{20}$ alkyl, or an aromatic group; M is a transition metal; and n is an integer between 6 and 100.

2. A polymer organic electroluminescence display comprising a substrate, an anode, a polymer organic luminescence layer, and a cathode, where the polymer organic luminescence layer comprises a compound represented by the following Chemical Formula 2:

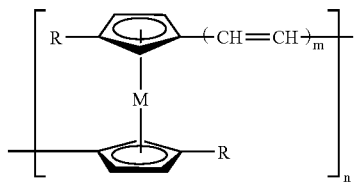

Chemical Formula 2 wherein R is in dependently or simultaneously a linear or branched $C_1$ to $C_{20}$ alkyl or an aromatic group; M is a transition metal; m is an integer between 1 and 100; and n is an integer between 6 and 100.

3. A polymer organic electroluminescence display comprising a substrate, an anode, a polymer organic luminescence layer, and a cathode, where the polymer organic luminescence layer comprises a compound represented by the following Chemical Formula 3:

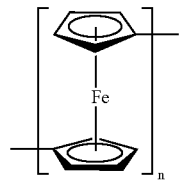

Chemical Formula 3 wherein n is an integer between 6 and 100.

4. A polymer organic electroluminescence display comprising a substrate, an anode, a polymer organic luminescence layer, and a cathode, where the polymer organic luminescence layer comprises a compound represented by the following Chemical Formula 4:

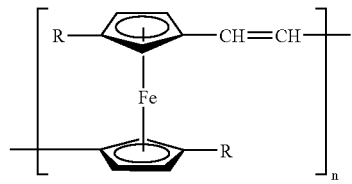

Chemical Formula 4 wherein R is independently or simultaneously a linear or branched $C_1$ to $C_{20}$ alkyl or an aromatic group, and n is an integer between 6 and 100.

5. A display device comprising the polymer organic electroluminescence display according to any one of claims 1 to 4.

6. The display device according to claim 5, which is a flat panel display (FPD).

* * * * *